United States Patent
Liggins

(10) Patent No.: US 10,040,367 B2
(45) Date of Patent: Aug. 7, 2018

(54) STATE OF CHARGE INDICATION

(71) Applicant: Jaguar Land Rover Limited, Conventry (GB)

(72) Inventor: Steve Liggins, Coventry (GB)

(73) Assignee: Jaguar Land Rover Limited, Whitley, Coventry (GB)

(*) Notice: Subject to any disclaimer, the term of this patent is extended or adjusted under 35 U.S.C. 154(b) by 81 days.

(21) Appl. No.: 14/909,583

(22) PCT Filed: Aug. 21, 2014

(86) PCT No.: PCT/EP2014/067855
§ 371 (c)(1),
(2) Date: Feb. 2, 2016

(87) PCT Pub. No.: WO2015/025016
PCT Pub. Date: Feb. 26, 2015

(65) Prior Publication Data
US 2016/0176311 A1    Jun. 23, 2016

(30) Foreign Application Priority Data
Aug. 21, 2013 (GB) .................................. 1314993.5

(51) Int. Cl.
*H02J 7/00* (2006.01)
*B60L 11/18* (2006.01)
(Continued)

(52) U.S. Cl.
CPC .......... *B60L 11/1862* (2013.01); *B60K 35/00* (2013.01); *G01R 31/3689* (2013.01);
(Continued)

(58) Field of Classification Search
CPC . H02J 7/0047; B60L 11/1862; G01R 31/3689
(Continued)

(56) References Cited

U.S. PATENT DOCUMENTS 4,280,574 A    7/1981  Terraillon
2009/0322503 A1*  12/2009  Suzuki .................. B60W 50/14
                                                            340/438
(Continued)

FOREIGN PATENT DOCUMENTS

DE    27 31 825 A1    2/1978
DE   102 49 765 A1    5/2004
(Continued)

OTHER PUBLICATIONS

Combined Search and Examination Report, GB 1314993.5, dated Mar. 12, 2014, 5 pages.
(Continued)

*Primary Examiner* — Edward Tso
*Assistant Examiner* — Aaron Piggush
(74) *Attorney, Agent, or Firm* — Myers Bigel, P.A.

(57) ABSTRACT

A system for providing a scale (11) of electrical charge of a vehicle battery and a hybrid vehicle comprising such a system comprises a scale (11) of state of charge of the vehicle battery. The scale (11) comprises minimum (14) and maximum (15) parameters and a controller to select the minimum (14) and maximum (15) parameters if the scale (11) in dependence on a battery usage parameter dependent on at least one of a mode of operation of the vehicle, a state of charge of the battery and a state of health of the battery. A display (10) for indicating an amount consists of the scale (11) and an indicator (12) movable with respect to the scale (11). Different scales (11) are provided for different purposes, and are changeable without altering the instant position of the indicator (12). The display (10) may indicate the state of charge of a battery of the hybrid electric vehicle having an internal combustion engine and motor/generator, different scales (11) having maxima (15) corresponding to different nominal or optimum states of charge.

20 Claims, 1 Drawing Sheet

(51) Int. Cl.
*B60K 35/00* (2006.01)
*G01R 31/36* (2006.01)
(52) U.S. Cl.
CPC .... *H02J 7/0047* (2013.01); *B60K 2350/1064* (2013.01); *H02J 2007/005* (2013.01)
(58) Field of Classification Search
USPC .................................. 320/104, 132; 324/435
See application file for complete search history.

(56) References Cited

U.S. PATENT DOCUMENTS

2010/0194553 A1    8/2010  Mizutani et al.
2014/0070606 A1*   3/2014  Gibeau ............... B60L 11/1862
                                                       307/9.1

FOREIGN PATENT DOCUMENTS

| DE | 10 2008 047 923 S1 | 3/2010 |
| DE | 10 2009 007 845 A1 | 8/2010 |
| EP | 2 070 787 A1 | 6/2009 |
| EP | 2 402 195 A2 | 1/2012 |
| FR | 2 976 889 | 12/2012 |
| GB | 1 485 923 | 9/1977 |
| JP | H05-172915 A | 7/1993 |
| JP | H10-288654 A | 10/1998 |
| JP | 2006-58184 | 3/2006 |
| JP | 2007-86191 | 4/2007 |
| JP | 2008-074321 A | 4/2008 |
| JP | 2010-83394 A | 4/2010 |
| JP | 2010-119224 A | 5/2010 |
| JP | 2012-147574 A | 8/2012 |
| JP | 2013-032132 A | 2/2013 |
| JP | 2013-074706 A | 4/2013 |

OTHER PUBLICATIONS

Combined Search and Examination Report, GB 1414887.8, dated Mar. 3, 2015, 5 pages.
Notification of Transmittal of the International Search Report and the Written Opinion, PCT/EP2014/067855, dated Mar. 5, 2015, 17 pages.
Office Action Summary, Japanese Patent Application No. 2016-535485, dated Nov. 29, 2016, 5 pages.
Office Action with English language translation, JP Application No. 2016-535485, dated Sep. 12, 2017, 5 pp.

* cited by examiner

STATE OF CHARGE INDICATION

RELATED APPLICATIONS

This application is a 35 U.S.C. § 371 national stage application of PCT Application No. PCT/EP2014/067855, filed on Aug. 21, 2014, which claims priority from Great Britain Patent Application No. 1314993.5 filed on Aug. 21, 2013, the contents of which are incorporated herein by reference in their entireties. The above-referenced PCT International Application was published in the English language as International Publication No. WO 2015/025016 A2 on Feb. 26, 2015.

TECHNICAL FIELD

This invention relates to a display for displaying an amount between a minimum and a maximum, such as an indicator for indicating a state of charge, in particular for indicating the state of charge of a battery of a hybrid electric vehicle.

BACKGROUND TO THE INVENTION

Hybrid electric vehicles are well known, and generally comprise an internal combustion engine, an electric motor, a battery and a control system for determining whether the vehicle is driven by the engine, the motor or a combination of engine and motor. The battery may be charged by a vehicle generator, or by the motor acting as a generator, for example during regenerative vehicle braking. In some circumstances the engine may drive the motor (as generator) to charge the battery.

Many factors influence how and when the vehicle battery should be charged when the vehicle is in use. For example account must be taken of the optimum state of charge of the battery, and the likely availability of opportunistic re-charging, for example by regenerative braking (at no fuel cost). The nominal state of charge may vary according to whether a vehicle driver has selected a program which is optimized for maximum fuel economy, maximum range or maximum performance. Charging of the battery may be controlled by a torque control system having a plurality of charging maps for each vehicle operating mode. In a hybrid electric vehicle, operating modes may include normal, electric (giving extended range under electric power), and sport (giving increased acceleration).

Charging maps may be determined empirically for a particular vehicle type or specification, and are not the subject of this invention as such.

Batteries used in hybrid vehicles have a relatively high voltage and certain characteristics, in particular they should in general not be fully discharged (0%) nor should they be repeatedly fully charged (100%), since this can be detrimental to battery life. The theoretical range of charge is less than 0-100%, and the useable range of charge may be smaller still, typically 25-75%.

In one embodiment the nominal state of charge of the battery may be at around 50%. This allows headroom for opportunistic recharging up the maximum usable state of charge of approximately 70%, and also allows the battery to operate at its most efficient state of charge.

The nominal state of charge may vary according to the operating mode of the vehicle, and the corresponding charging map.

The state of charge is generally indicated to the vehicle driver by means of a dashboard or instrument panel display, which may show a maximum and minimum corresponding to the range of charge which is permitted by the torque control system.

Typically the vehicle driver is not presented with an indicator of the full theoretical range of charge because to do so would give a misleading impression that the battery could not reach a desired 'maximum' charge. As noted above maximum theoretical charge is not desirable.

Accordingly the vehicle driver is generally presented with a display or indicator representing in effect a reduced range, in which the displayed minimum may correspond to 25% charge, and the displayed maximum to 75% charge.

Nevertheless, considering that a control allowance is included for opportunistic recharging, and to permit different levels of nominal charge, a conventional charge indicator may typically reach the maximum charge indication only seldom.

The present invention provides a method of displaying the state of charge and a display which addresses this circumstance, and gives an appropriate indication of the state of charge to the vehicle driver.

SUMMARY OF THE INVENTION

Aspects of the invention are defined in the appended claims.

According to an aspect of the invention there is provided a system for providing a scale of electrical charge of a vehicle battery, the system comprising:
a scale of state of charge of the vehicle battery, the scale comprising minimum and maximum parameters; and
a controller arranged to select the maximum and minimum parameters of the scale in dependence on a battery usage parameter, wherein the battery usage parameter is dependent on at least one of: a mode of operation of the vehicle; a state of charge of the battery; and a state of health of the battery.

In an embodiment the system comprises:
a state of charge detector for detecting the state of charge of the vehicle battery; and
a display arranged to display the scale of state of charge of the battery and the detected state of charge of the battery,
wherein the controller is arranged to control the display to display the scale in dependence on the detected state of charge of the battery.

This is advantageous because the maximum and minimum parameters of the scale may be selected without affecting an indicator linked to the state of charge of the battery. For example, the indicator may be movable with respect to the scale for indicating an instant value of state of charge on the scale, wherein the range of the scale is adapted to be changed without movement of said indicator.

According to an aspect of the invention there is provided a display for displaying an amount between a minimum and a maximum, said display comprising a scale indicating a progressive increase from minimum to maximum, and an indicator movable with respect to the scale for indicating the instant value on said scale, wherein the range of said scale is adapted to be changed without movement of said indicator.

The scale may be made longer or shorter, and may be lengthened or shortened asymmetrically. In such a display, the scale may for example be adapted to show an extension in certain circumstances, the instant position of the indicator being substantially unchanged regardless of whether the extension is provided or is not provided.

The extension may, for example, be hidden, and revealed only when circumstances permit. The scale and extension may be real or virtual. In the case of an electronic display, the extension may be caused to appear and disappear, as required, according to whether power is applied to particular display elements. The scale may be illuminated or projected, and thus may the extension be hidden or revealed. A mechanically actuated shutter may be provided whereby the extension is revealed when required.

An important aspect of the invention is that the indicator, which may for example be a real or virtual pointer, does not change in position upon a change in the range of the scale.

In the case of an extension to the scale, which may be at the minimum or maximum, the extension may be differently represented so as to be distinguishable. An extension may for example be denoted by different scale markings, and/or different frequency of scale markings, and/or different colouring.

In an embodiment of the invention, the display is an indicator of battery charge in a hybrid electric vehicle, and comprises a progressive charge display having a first indicator of a charge level, a second indicator of a charge level higher than that of the first indicator, and a range therebetween, wherein an extension to said range is provided, said extension being represented differently to said range. A scale, which may progressively increase, is provided between the first and second indicators, which may respectively represent a normal minimum charge and a normal maximum charge. The extension may represent an extended charge, which is available in certain circumstances of use. The normal maximum charge may be the nominal state of charge of the battery.

According to an aspect of the invention there is provided a method wherein said extension is enabled in a predetermined charge condition.

The method may comprise changing the range of said scale upon selection by a vehicle driver of a mode that is associated with a different nominal state of charge of a battery.

Aspects of the invention relate to the display, to a vehicle instrument panel and to a vehicle incorporating the display in an instrument panel.

Features of the progressive charge display will be apparent from the claims appended hereto.

Within the scope of this application it is expressly envisaged that the various aspects, embodiments, examples and alternatives set out in the preceding paragraphs, in the claims and/or in the following description and drawings, and in particular the individual features thereof, may be taken independently or in any combination. Features described in connection with one embodiment are applicable to all embodiments, unless such features are incompatible.

BRIEF DESCRIPTION OF DRAWINGS

Other features of aspects of the invention will be apparent from the following description of embodiments illustrated by way of example only in the accompanying drawings in which.

DESCRIPTION OF EMBODIMENTS

Figure 1:
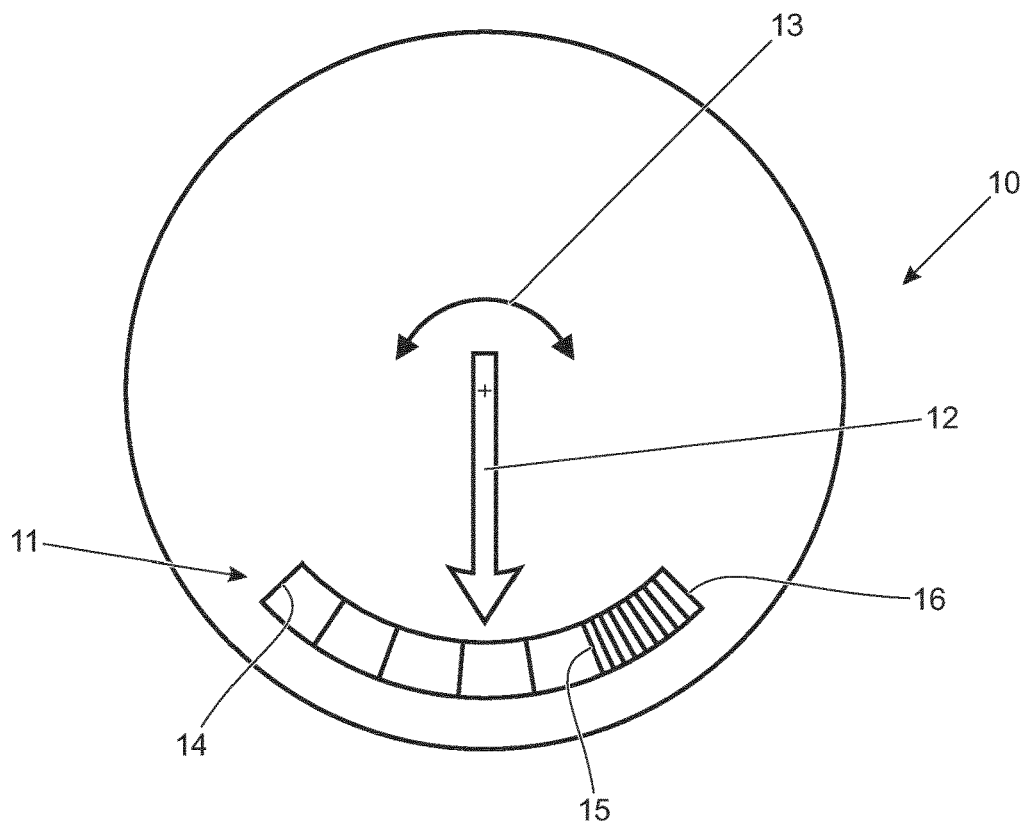
FIG. 1 represents an embodiment of a display according to aspects of the invention.

With reference to the drawings a state of charge indicator or display 10 of a hybrid electric vehicle comprises a conventional circular dashboard dial having an arcuate scale 11 and a pointer 12 which can swing across the scale, as indicated by arrow 13, from a minimum to a maximum. The scale and the pointer may each be real or virtual.

The arcuate scale 11 comprises a first portion with widely spaced graduations, and a second portion with closely spaced graduations.

In the example illustrated the minimum 14 is represented by the left hand end of the scale, and the maximum 15 by the right hand end of the first scale portion. The second scale portion represents an extension to the charge range, and terminates at an extended maximum 16 at the extreme right hand end of the scale.

The minimum 14 and maximum 15 may be for example marked 'MIN' and 'MAX', and correspond to the nominal range of charge selected by a charge control program. The range may represent, for example, 30-50% of the theoretical maximum charge of for example a hybrid vehicle battery, and be optimised for overall fuel economy of the vehicle.

Adjustment of the minimum 14 and/or maximum 15 and/or provision of the extension is performed by a controller (not shown). The controller determines the charge control program, or battery usage parameter, dependent on at least one of: a mode of operation of the vehicle; a state of charge of the battery; and a state of health of the battery.

The extension represents an allowance, typically for opportunistic recharging, which permits the state of charge to reach for example 70% of the theoretical maximum charge, for example for optimising for city driving under electric power only. For example, city driving mode may be selected.

The vehicle driver will thus be aware that a maximum nominal charge is reachable in normal use, and will not be concerned that the vehicle battery is faulty or that a charging fault has developed. The extension to the charge range represents an extended charge which is available in certain conditions of use associated with an action by the vehicle driver.

The means by which the extension is distinguished from the normal range requires that a difference be noticeable. The difference may include a colour difference, and the colour of the extension may for example be blue, which is a colour that has become associated in the popular mind with electric vehicles or electrical vehicle travel.

The indicator may be electronically generated, or may be a conventional instrument, or may be a combination.

In one embodiment the extension may be visible only if the state of charge exceeds normal maximum 15, and in a variant the amount of extension which is visible may correspond to the state of charge that has been reached.

In an embodiment the extension is visible only when certain vehicle programmes are activated. For example a vehicle driver may prepare for an extended period of driving in an electric mode by activating an 'E' program. In such circumstances the extension may be made visible, and the engine may be commanded to charge the battery so as to increase the available range under electric drive only, to the extent permitted by the torque control system. In the example given above, the nominal state of charge of the battery will be increased from 50% to 70%, and the vehicle driver will be aware of the increased charge by virtue of the pointer 12 entering the extended range.

Likewise the vehicle driver may require a period of rapid acceleration in a sport mode, and activate an 'S' program in which both the engine and electric motor fully contribute to accelerating the vehicle. In consequence a greater reservoir of charge may be required, and accordingly when the driver is not commanding significant torque, the engine will be used to both drive the vehicle and to charge the battery to the extension limit of 70%. Such charging is opportunistic in the sense that should the vehicle driver command significant torque from the vehicle engine, charging of the battery in this mode will be suspended.

It will be understood that the foregoing example quotes exemplar charging limits and ranges, which may of course be varied according to vehicle and conditions of use. In particular different levels for optimum charge and charge extension may be determined according to mode of vehicle use.

Figure 2:
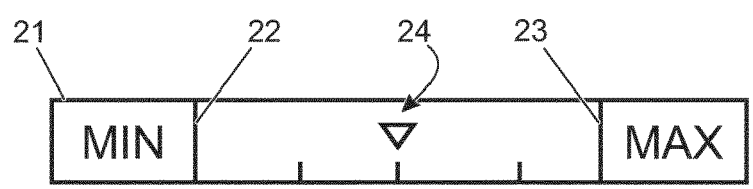
FIGS. 2 and 3 represent an alternative embodiment according to aspects of the invention.
Figure 3:
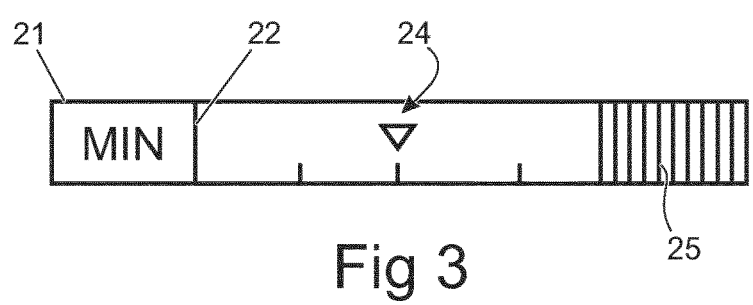

An example of a change between scales is illustrated in FIGS. 2 and 3. The linear scale 21 of FIG. 2 has minimum and maximum markings 22, 23 and progressive markings therebetween indicating 25%, 50% and 75% of nominal charge capacity range (which may represent a range 30-50% of the theoretical charge of the battery). An indicator 24 for the scale, indicates the current value of charge. In place of a pointer a progressive colour change, a series of lights or any other progressive indicator could be used.

In FIG. 3, the MAX identifier is substituted by a high frequency banding 25, which corresponds to the charge extension of FIG. 1.

In switching from the scale of FIG. 2 to that of FIG. 3, the position of the indicator 24 is not changed, but the scale is extended to show the possibility of an increased state of charge (for example up to 70% of the theoretical charge of the battery), for example in preparation for city or sport driving according to a preference of the vehicle driver.

Upon cessation of conditions for the extended scale of FIG. 3, the display reverts to the scale of FIG. 2, and maximum charge may be indicated notwithstanding that the actual state of charge corresponds to a value within zone 25.

Variations and improvements to the invention are possible within the scope of the claims appended hereto.

Aspects of the invention will be apparent from the numbered paragraphs that follow:

1. A display for displaying an amount between a minimum and a maximum, said display comprising a scale indicating a progressive increase from minimum to maximum, and an indicator movable with respect to the scale for indicating the instant value on said scale, wherein the range of said scale is adapted to be changed without movement of said indicator.

2. A display according to aspect 1 for indicating progressively a state of electrical charge of a battery, said display having a first indicator, a second indicator higher than the first indicator and a progressively increasing range of indication therebetween, wherein an extension to said range is provided, said extension being represented differently to said range.

3. A display according to aspect 2 and comprising a third indicator higher than said second indicator, said extension being between said second and third indicators.

4. A display according to aspect 3 wherein said first indicator corresponds to a minimum, said second indicator corresponds to a maximum, and said third indicator corresponds to an extended maximum.

5. A display according to aspect 2 wherein said extension is enabled in a pre-determined charge condition.

6. A display according to aspect 5 wherein said extension is visible only in said pre-determined charge condition.

7. A display according to aspect 2 wherein said extension is coloured differently to said range.

8. A display according to aspect 2 wherein said range comprises a first linear scale, and said extension comprises a second linear scale.

9. A display according to aspect 8 wherein said first linear scale comprises a sequence of marks at a first frequency, and wherein said second linear scale comprises a sequence of marks at a second frequency.

10. A display according to aspect 9 wherein the second frequency is at least twice that of the first frequency.

11. A display according to aspect 8 wherein said first and second linear scales comprise a single arc, and wherein an indicator needle is centred on said arc.

12. A display according to aspect 2, and comprising an instrument having a face, markings on said face to indicate said range and said extension, and an indicator needle movable along said range and said extension to progressively indicate a state of charge.

13. A hybrid electric vehicle having a display according to aspect 1, said vehicle including driver selectable modes of hybrid use, and being adapted to provide on said display a range of indication determined by the selected mode.

14. A vehicle according to aspect 13 and having driver selectable modes adapted to optimise one of fuel economy, distance in electric mode, and vehicle acceleration.

15. A method of displaying an amount between a minimum and a maximum by providing a scale, and an indicator for indicating on said scale an instant value of said amount, said method comprising:
   providing a plurality of said scales for display one by one with said indicator, and
   switching between scales whilst maintaining the instant position of said indicator.

16. A method according to aspect 15 and comprising displaying a state of charge of a battery of a hybrid electric vehicle, the method comprising:
   selecting a mode of vehicle operation from optimised fuel economy, optimised distance under solely electric power and optimised vehicle acceleration,
   and displaying a scale having a maximum appropriate to the selected mode.

17. A method according to aspect 16 and comprising displaying a nominal scale in a first mode of operation, and displaying an extension to said nominal scale in a second mode of operation.

18. A method according to aspect 17 wherein said nominal scale is between a minimum and a maximum, and said extension is above said maximum.

19. A method according to aspect 18 wherein said extension is provided in a mode corresponding to maximum distance under electric power, or in a mode corresponding to maximum performance.

20. A method according to aspect 17 wherein said extension is displayed differently to said nominal scale.

The invention claimed is:

1. A system for providing a scale of electrical charge of a vehicle battery, the system comprising:
   a scale of state of charge of the vehicle battery, the scale comprising minimum and maximum parameters; and
   a controller arranged to display a marker on the scale, the marker indicating the state of charge detected by a detector, wherein the controller is arranged to control the marker to appear on the scale between a displayed first indicator indicating a first permissible minimum state of charge and a displayed second indicator indicating a first permissible maximum state of charge when the vehicle is in a first driving mode;

wherein the controller is arranged to control the marker indicating the state of charge detected to appear on the scale between the displayed first and a displayed third indicator when the vehicle is in a second driving mode;

wherein the third indicator indicates a second permissible maximum state of charge;

wherein the second permissible maximum state of charge is higher than the first permissible maximum state of charge; and wherein the displayed second indicator and the displayed third indicator are both displayed on the scale when the vehicle is in the second driving mode.

2. The system of claim 1, further comprising:

a display arranged to display the scale of state of charge of the battery and the state of charge detected, wherein the controller is arranged to control the display to display the scale in dependence on the state of charge detected.

3. The system of claim 2, wherein said display comprises the first indicator, the second indicator higher than the first indicator and a progressively increasing range of indication therebetween, and wherein said display comprises an extension to said range, said extension being represented differently to said range.

4. The system of claim 3, further comprising the third indicator higher than said second indicator, said extension being between said second and third indicators.

5. The system of claim 4, wherein said first indicator corresponds to the minimum parameter, wherein the controller is arranged to select the minimum parameter, wherein said second indicator corresponds to the maximum parameter, and said third indicator corresponds to an extended maximum parameter.

6. The system of claim 3, wherein said extension is enabled in a pre-determined charge condition.

7. The system of claim 6, wherein said extension is visible only in said pre-determined charge condition.

8. The system of claim 3, wherein said range comprises a first linear scale, and said extension comprises a second linear scale.

9. The system of claim 8, wherein said first linear scale comprises a sequence of marks at a first frequency, and wherein said second linear scale comprises a sequence of marks at a second frequency.

10. The system of claim 9, wherein the second frequency is at least twice that of the first frequency.

11. The system of claim 8, wherein said first and second linear scales comprise a single arc, and wherein the display comprises the marker, the marker being centred on said arc.

12. The system of claim 3, further comprising an instrument having a face, markings on said face to indicate said range and said extension, and the marker movable along said range and said extension to progressively indicate the state of charge.

13. A hybrid electric vehicle having a system according to claim 2, said vehicle including selectable driving modes of hybrid use, and being adapted to provide on said display a range of indication determined by the selected driving mode.

14. The vehicle of claim 13, further comprising selectable driving modes adapted to optimize one of fuel economy, distance in electric mode, and vehicle acceleration.

15. The system of claim 1, wherein the maximum parameter is associated with a maximum permitted charge, different from a current value of charge.

16. The system of claim 1, wherein the controller is arranged to change displaying the marker between the displayed first indicator and the displayed second indicator and between the displayed first indicator and the displayed third indicator in dependence upon a change in selection by a vehicle driver of the first driving mode or the second driving mode.

17. The system of claim 1, wherein controlling the marker to appear between the displayed first indicator and the displayed third indicator instead of between the displayed first indicator and the displayed second indicator is additionally dependent on at least one of: a state of charge of the vehicle battery, and a state of health of the vehicle battery.

18. A system for providing a scale of electrical charge of a vehicle battery, the system comprising:

a displayed scale of state of charge of the vehicle battery, the displayed scale comprising a minimum parameter and a maximum parameter; and a controller arranged to select a value for the maximum parameter and/or a value for the minimum parameter of the displayed scale in dependence on a battery usage parameter, wherein the battery usage parameter is dependent on at least a mode of operation of the vehicle, selected from a plurality of driving modes of the vehicle;

wherein the controller is arranged to select a first value for the maximum parameter and/or a first value for the minimum parameter of the displayed scale when a first driving mode is selected as the mode of operation of the vehicle, wherein the first value for the maximum parameter and the first value for the minimum parameter define a first range of state of charge values in the displayed scale, wherein the first range of state of charge values in the displayed scale indicate all possible state of charge values available while the first driving mode is selected as the mode of operation of the vehicle;

wherein the controller is arranged to select a second value for the maximum parameter and/or a second value for the minimum parameter of the displayed scale when a second driving mode is selected as the mode of operation of the vehicle, wherein the second value for the maximum parameter and the second value for the minimum parameter define a second range of state of charge values in the displayed scale, wherein the second range of state of charge values in the displayed scale indicate all possible state of charge values available while the second driving mode is selected as the mode of operation of the vehicle; and wherein the second value for the maximum parameter represents a higher state of charge value than the first value for the maximum parameter, wherein the first value for the maximum parameter and the second value for the maximum parameter define an extension range of state of charge values in the displayed scale, wherein the state of charge values within the extension range represent possible state of charge values while the second driving mode is selected as the mode of operation of the vehicle that are not possible state of charge values while the first driving mode is selected as the mode of operation of the vehicle.

19. The system of claim 18, wherein the first value for the minimum parameter and the second value for the minimum parameter are the same state of charge value.

20. A system for providing a scale of electrical charge of a vehicle battery, the system comprising:

a scale of state of charge of the vehicle battery, the scale comprising minimum and maximum parameters;

a controller arranged to select the maximum and/or minimum parameters of the scale in dependence on a battery usage parameter, wherein the battery usage parameter is dependent on at least a mode of operation of the vehicle, selected from a plurality of driving modes of the vehicle;

a state of charge detector arranged to detect a state of charge of the vehicle battery; and a display arranged to display the scale of state of charge of the battery and the detected state of charge of the battery, wherein the controller is arranged to control the display to display the scale in dependence on the detected state of charge of the battery;

wherein said display comprises a first indicator, a second indicator higher than the first indicator and a progressively increasing range of indication therebetween, and wherein said display comprises an extension to said range, said extension being represented differently to said range;

wherein said range comprises a first linear scale, and said extension comprises a second linear scale; and wherein said first linear scale comprises a sequence of marks at a first frequency, and wherein said second linear scale comprises a sequence of marks at a second frequency.

* * * * *